(12) United States Patent
Hong

(10) Patent No.: US 11,699,684 B2
(45) Date of Patent: Jul. 11, 2023

(54) SEMICONDUCTOR PACKAGE INCLUDING HEAT DISSIPATION LAYER

(71) Applicant: SK hynix Inc., Icheon-si (KR)

(72) Inventor: Joo Wan Hong, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 46 days.

(21) Appl. No.: 17/234,427

(22) Filed: Apr. 19, 2021

(65) Prior Publication Data

US 2022/0173072 A1 Jun. 2, 2022

(30) Foreign Application Priority Data

Dec. 2, 2020 (KR) .................. 10-2020-0167021

(51) Int. Cl.
*H01L 25/065* (2023.01)
*H01L 23/00* (2006.01)
*H01L 23/367* (2006.01)
*H01L 23/13* (2006.01)
*H01L 23/498* (2006.01)
*H01L 25/18* (2023.01)

(52) U.S. Cl.
CPC .......... *H01L 25/0657* (2013.01); *H01L 23/13* (2013.01); *H01L 23/367* (2013.01); *H01L 23/49833* (2013.01); *H01L 23/49838* (2013.01); *H01L 24/14* (2013.01); *H01L 25/18* (2013.01); *H01L 2224/14519* (2013.01); *H01L 2225/06513* (2013.01); *H01L 2225/06517* (2013.01); *H01L 2225/06541* (2013.01); *H01L 2225/06586* (2013.01); *H01L 2225/06589* (2013.01); *H01L 2924/1431* (2013.01); *H01L 2924/1434* (2013.01)

(58) Field of Classification Search
None
See application file for complete search history.

(56) References Cited

U.S. PATENT DOCUMENTS

2017/0352612 A1\* 12/2017 Sung .................... H01L 21/486
2018/0175002 A1 6/2018 Loo et al.

FOREIGN PATENT DOCUMENTS

| KR | 1020160035799 A | 4/2016 |
| KR | 1020170075125 A | 7/2017 |
| KR | 1020170136934 A | 12/2017 |

\* cited by examiner

*Primary Examiner* — Long Pham
(74) *Attorney, Agent, or Firm* — William Park & Associates Ltd.

(57) ABSTRACT

A semiconductor package includes an interposer including first and second surfaces opposite to each other. The semiconductor package also includes a heat dissipation layer disposed on the first surface of the interposer and a first semiconductor die mounted on the first surface of the interposer. The semiconductor package additionally includes a stack of second semiconductor dies mounted on the second surface of the interposer. The semiconductor package further includes a thermally conductive connection part for transferring heat from the stack of the second semiconductor dies to the heat dissipation layer.

16 Claims, 9 Drawing Sheets

SEMICONDUCTOR PACKAGE INCLUDING HEAT DISSIPATION LAYER

CROSS-REFERENCE TO RELATED APPLICATIONS

The present application claims priority under 35 U.S.C. 119(a) to Korean Application No. 10-2020-0167021, filed on Dec. 2, 2020, which is incorporated herein by reference in its entirety.

BACKGROUND

1. Technical Field

The present disclosure generally relates to packaging technology and, more particularly, to a semiconductor package including a heat dissipation layer.

2. Related Art

Various attempts have been made to integrate a plurality of semiconductor dies into one package structure. Such semiconductor packages are expected to perform high-speed operation, large-capacity data processing operation, or multifunctional operation. As a plurality of semiconductor dies are embedded in a semiconductor package, heat associated with the operations of the semiconductor dies might not be satisfactorily discharged to the outside of the semiconductor package and may accumulate within in the semiconductor package. Excessive heat retained in the semiconductor package may adversely affect the operations of the semiconductor dies within the semiconductor package. Accordingly, there is increasing demand for heat dissipation solutions for semiconductor packages.

SUMMARY

In accordance with an embodiment of the present disclosure is a semiconductor package including an interposer including first and second surfaces opposite to each other, a heat dissipation layer disposed on the first surface of the interposer, a first semiconductor die mounted on the first surface of the interposer, a stack of second semiconductor dies mounted on the second surface of the interposer, and a thermally conductive connection part for transferring heat from the stack of the second semiconductor dies to the heat dissipation layer.

In accordance with an embodiment of the present disclosure is a semiconductor package including a package substrate including a cavity, an interposer disposed on the package substrate and including first and second surfaces opposite to each other, a heat dissipation layer disposed on the first surface of the interposer, a first semiconductor die mounted on the first surface of the interposer, a stack of second semiconductor dies mounted on the second surface of the interposer and positioned in the cavity of the package substrate, and a thermally conductive connection part for transferring heat from the stack of the second semiconductor dies to the heat dissipation layer.

In accordance with an embodiment of the present disclosure is a semiconductor package including an interposer including first and second surfaces opposite to each other, a heat dissipation layer disposed on the first surface of the interposer, a first semiconductor die mounted on the first surface of the interposer, a stack of second semiconductor dies mounted on the second surface of the interposer, and a thermally conductive connection part. The thermally conductive connection part includes a thermally conductive via penetrating through the interposer to thermally connect with the heat dissipation layer disposed on the first surface of the interposer and a thermally conductive connector thermally connecting the thermally conductive via to the stack of second semiconductor dies mounted on the second surface of the interposer.

DETAILED DESCRIPTION

Figure 1:
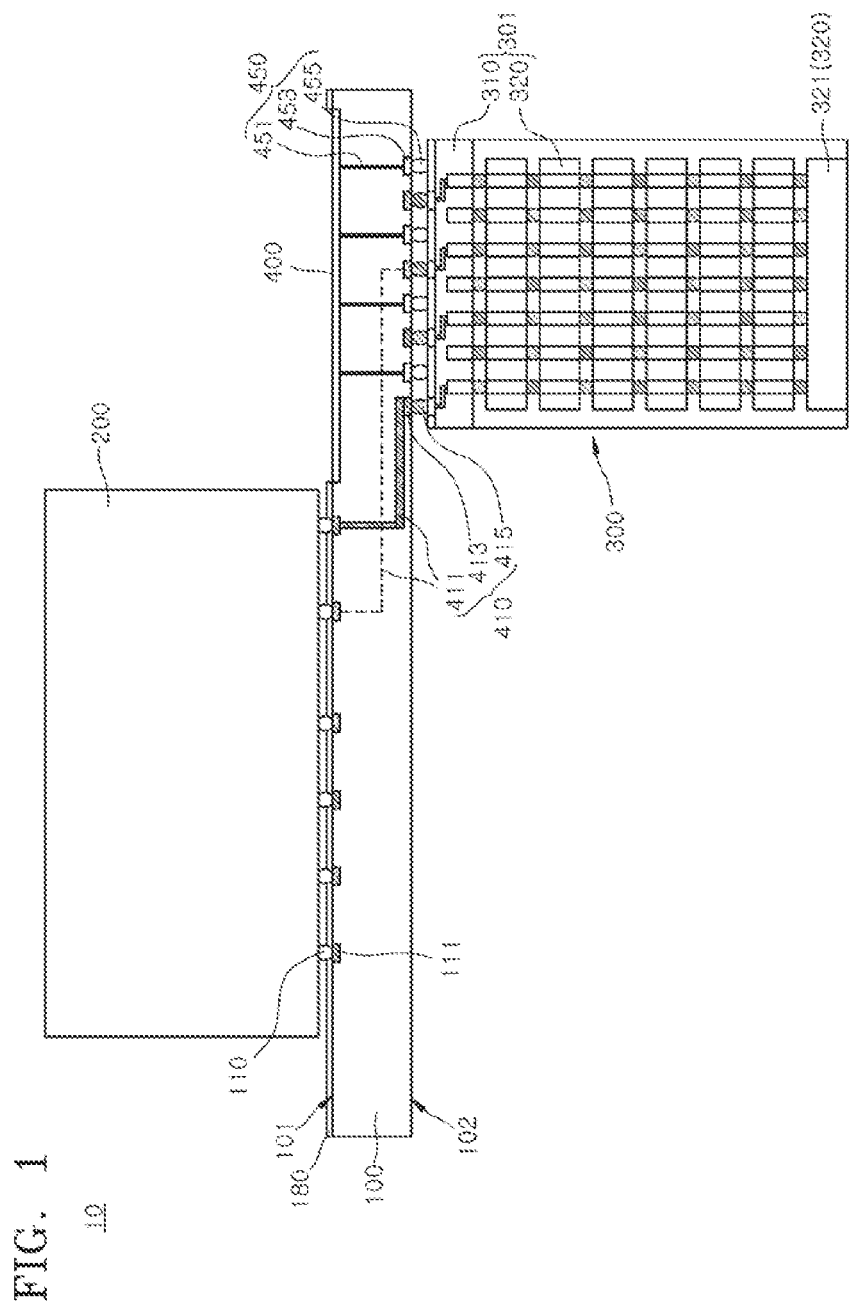
FIG. 1 is a schematic cross-sectional view illustrating a semiconductor package according to an embodiment of the present disclosure.

The terms used herein may correspond to words selected in consideration of their functions in presented embodiments, and the meanings of the terms may be construed to be different according to ordinary skill in the art to which the embodiments belong. If defined in detail, the terms may be construed according to the definitions. Unless otherwise defined, the terms (including technical and scientific terms) used herein have the same meaning as commonly understood by one of ordinary skill in the art to which the embodiments belong.

It will be understood that although the terms "first," "second," "third," etc. may be used herein to describe various devices, these devices should not be limited by these terms. These terms are only used to distinguish one device from another device, and not used to indicate a particular sequence or number of devices.

A semiconductor device may include a semiconductor substrate or a structure in which a plurality of semiconductor substrates are stacked. The semiconductor device may indicate a semiconductor package structure in which a structure in which semiconductor substrates are stacked is packaged. The semiconductor substrate may indicate a semiconductor wafer, a semiconductor die, or a semiconductor chip in which electronic components and devices are integrated. The semiconductor chip may indicate memory chips in which memory integrated circuits such as dynamic random access memory (DRAM) circuits, static random access memory (SRAM) circuits, NAND-type flash memory circuits, NOR-type flash memory circuits, magnetic random access memory (MRAM) circuits, resistive random access memory (Re RAM) circuits, ferroelectric random access memory (FeRAM) circuits, or phase change random access memory (PcRAM) are integrated, logic dies or ASIC chips in which logic circuits are integrated in a semiconductor substrate, or processor such as application processors (APs), graphic processing units (GPUs), central processing units (CPUs) or system-on-chips (SoCs). The semiconductor devices may be employed in information communication systems such as mobile phones, electronic systems associated with biotechnology or health care, or wearable electronic systems. The semiconductor packages may be applicable to internet of things (IoT).

Same reference numerals refer to same devices throughout the specification. Even though a reference numeral might not be indicated or described with reference to a particular drawing, the reference numeral may be indicated or described with reference to another drawing. In addition, even though a reference numeral might not be shown in a particular drawing, it may be shown in another drawing.

FIG. 1 is a schematic cross-sectional view illustrating a semiconductor package 10 according to an embodiment of the present disclosure.

Referring to FIG. 1, the semiconductor package 10 may include an interposer 100, a first semiconductor die 200, and a stack 300 of second semiconductor dies. The interposer 100 may be an interconnection element to which the first semiconductor die 200 and the stack 300 of the second semiconductor dies are electrically connected. The interposer 100 may electrically or signally connect the first semiconductor die 200 and the stack 300 of the second semiconductor dies. The interposer 100 may electrically or signally connect the first semiconductor die 200 to another external device (not illustrated) or a package substrate (not illustrated). The interposer 100 may electrically or signally connect the stack 300 of the second semiconductor dies to another external device (not illustrated) or a package substrate (not illustrated). To signally connect objects means to connect the objects in a way that allows signals to be transmitted between the objects. This allows the object to signally communicate.

The interposer 100 may have the shape of a substrate and include a first surface 101 and a second surface 102. The first surface 101 and the second surface 102 may be surfaces opposite to each other. The first semiconductor die 200 may be mounted on the first surface 101 of the interposer 100. First connectors 110 may be introduced between the first surface 101 and the first semiconductor die 200. Each of the first connectors 110 may be made of or include an electrically conductive material. Each of the first connectors 110 may be made of or include a solder material or a metallic material such as gold (Au) or copper (Cu). Each of the first connectors 110 may have a bump shape.

The first connectors 110 may electrically connect the first semiconductor die 200 to the interposer 100. The interposer 100 may include first connector pads 111 under the first surface 101, to which the first connectors 110 are connected. Each of the first connector pads 111 may include a layer of an electrically conductive material.

The interposer 100 may include a heat dissipation layer 400 on the first surface 101. The heat dissipation layer 400 may be a layer for dissipating heat. The heat dissipation layer 400 may be spaced apart from the first connector pads 111. The heat dissipation layer 400 may be made of or include substantially the same material as the first connector pads 111. In an embodiment, the heat dissipation layer 400 may be made or include a layer of a metallic material such as copper (Cu). The heat dissipation layer 400 may have a plate shape for dissipating heat.

The heat dissipation layer 400 may be disposed on the first surface 101 of the interposer 100 to be exposed to the outside the first semiconductor die 200 so as to be advantageous in heat dissipation by radiating heat to the outside the first semiconductor die 200. The heat dissipation layer 400 may be disposed to be exposed to the outside of the first semiconductor die 200 without being covered. A passivation layer 180 may be disposed on the first surface 101 of the interposer 100. The passivation layer 180 may include an insulation layer electrically separating the first connector pads 111 from each other. The passivation layer 180 may expose surfaces of the first connector pads 111. The passivation layer may expose the surface of the heat dissipation layer 400.

The stack 300 of the second semiconductor dies may be mounted on the second surface 102 of the interposer 100.

Figure 2:
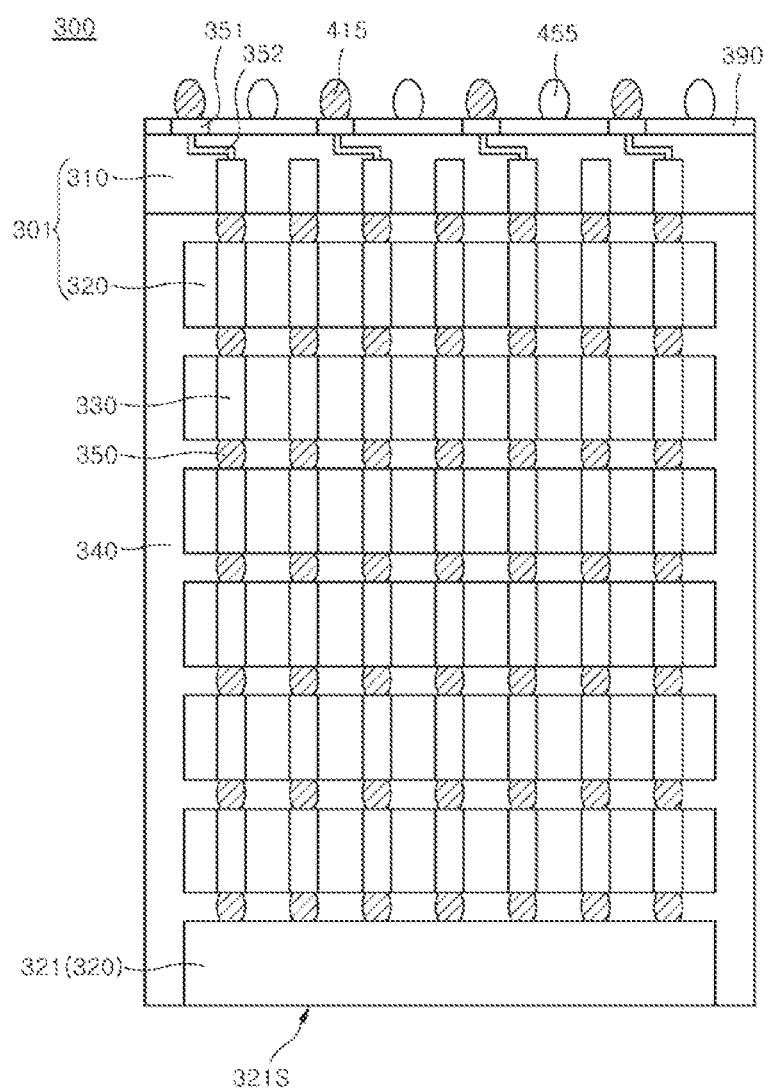
FIG. 2 is an enlarged schematic cross-sectional view illustrating a stack of second semiconductor dies of the semiconductor package of FIG. 1.

FIG. 2 is an enlarged schematic cross-sectional view illustrating the stack 300 of the second semiconductor dies of the semiconductor package 10 of FIG. 1.

Referring to FIGS. 2 and 1, a plurality of second semiconductor dies 301 may be stacked up in a column to constitute the stack 300 of the second semiconductor dies. The stack 300 of the second semiconductor dies may include a high bandwidth memory (HBM) device. The HBM device may be configured in a structure in which a plurality of core dies 320 are stacked below a base die 310. The core dies 320 may include memory devices, and the base die 310 may include a logic device for controlling the core dies 320. The base die 310 may include an interface through which the core dies 320 and the first semiconductor die 200 signally communicate with each other.

The stack 300 of the second semiconductor dies may include first electrical through vias 330 electrically connecting the second semiconductor dies 301 to each other vertically. The first electrical through vias 330 may be connection elements that substantially penetrate the second semiconductor dies 301. Each of the first electrical through vias 330 may have a structure of a through silicon via (TSV). First electrical through vias 330 positioned in a common column be electrically connected to each other by inner connectors 350. First electrical through vias 330 may be omitted in a lowermost core die 321. The lowermost core die 321 may be positioned on the lowermost layer among the second semiconductor dies 301.

The stack 300 of the second semiconductor dies may further include an encapsulation layer 340. The encapsulation layer 340 may be disposed as a layer for covering and protecting the core dies 320. The encapsulation layer 340 may have a shape in which a surface 321S of the lowermost core die 321 is left exposed to the outside of the stack 300. The shape of the encapsulation layer 340 leaving the surface 321S of the lowermost core die 321 exposed may contribute to dissipating heat from the inside of the stack 300 of the second semiconductor dies to the outside of the stack 300.

Figure 3:
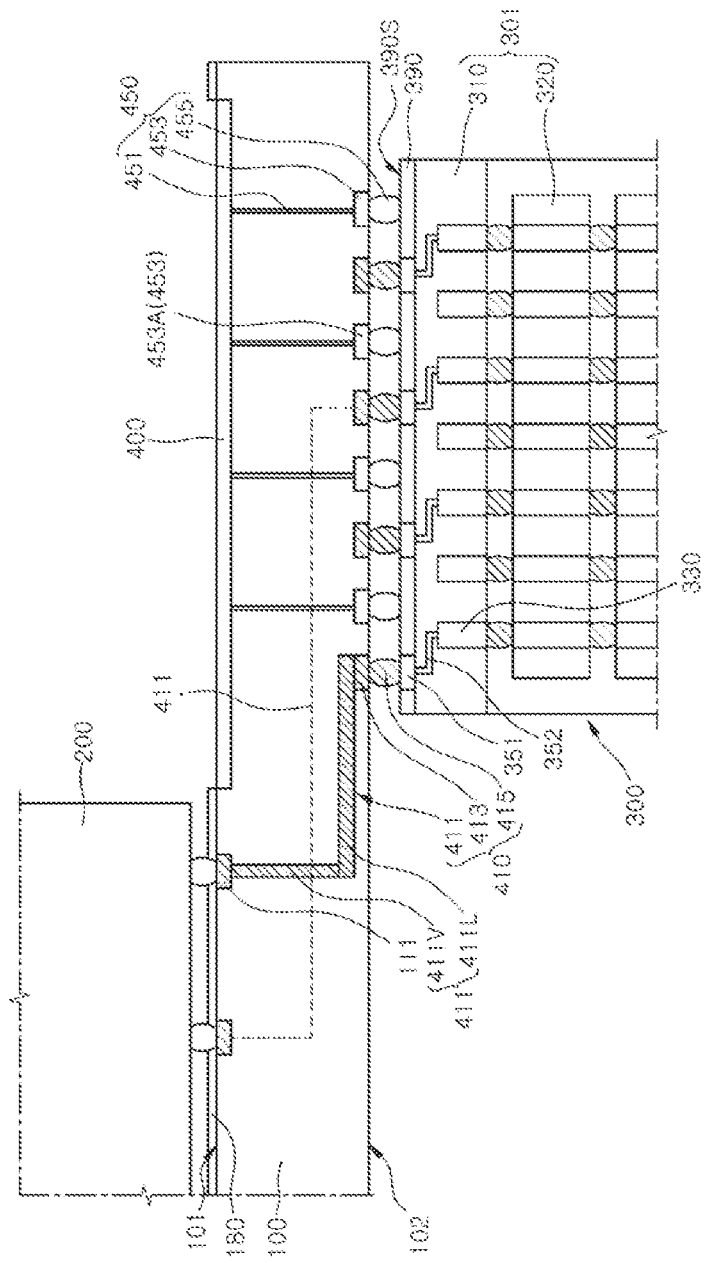
FIG. 3 is an enlarged schematic cross-sectional view illustrating a portion of a heat dissipation layer of the semiconductor package of FIG. 1.

FIG. 3 is an enlarged schematic cross-sectional view illustrating a portion of the heat dissipation layer 400 and a peripheral portion of the semiconductor package 10 of FIG. 1.

Referring to FIGS. 3 and 1, the semiconductor package 10 may further include a thermally conductive connection part 450. The thermally conductive connection part 450 may configure heat transfer paths through which heat generated in the stack 300 of the second semiconductor dies is transferred to the heat dissipation layer 400.

The thermally conductive connection part 450 may include a plurality of thermally conductive vias 451 disposed in the interposer 100. The thermally conductive connection part 450 may further include a plurality of thermally conductive pads 453 disposed on the second surface 102 of the interposer 100. The thermally conductive connection part 450 may further include a plurality of thermally conductive connectors 455 introduced between the second surface 102 of the interposer 100 and the stack 300 of the second semiconductor dies.

The thermally conductive vias 451 may be disposed as through vias that substantially vertically penetrate the interposer 100. Each of the thermally conductive vias 451 may have a shape extending from the first surface 101 of the interposer 100 to the second surface 102 of the interposer 100. The thermally conductive vias 451 may be thermally connected to or may directly contact the heat dissipation layer 400. Because the plurality of thermally conductive vias 451 are thermally connected to the heat dissipation layer 400, heat transfer efficiency from the stack 300 of the second semiconductor dies to the heat dissipation layer 400 may be improved over a case where the thermally conductive vias are not introduced.

Each of the thermally conductive vias 451 may be made of or include a thermally conductive material. Each of the thermally conductive vias 451 may be made of or include substantially the same thermally conductive material as the heat dissipation layer 400. Each of the thermally conductive vias 451 may be made of or include a metallic material such as copper (Cu). Each of the thermally conductive vias 451 may be disposed in a shape of a TSV, for example.

The thermally conductive pads 453 may be disposed on the second surface 102 of the interposer 100 and patterned to be spaced part from each other. Each of the thermally conductive pads 453 may be thermally connected to each of the thermally conductive vias 451, respectively. Each of the thermally conductive pads 453 may be physically connected to each of the thermally conductive vias 451, respectively. Each of the thermally conductive pads 453 may be made of or include a conductive material. Each of the thermally conductive pads 453 may be made of or include substantially the same conductive material as the heat dissipation layer 400 or the thermally conductive vias 451. Each of the thermally conductive pads 453 may be made of or include a metallic material such as copper (Cu).

Each of the thermally conductive pads 453 may thermally connect each of the thermally conductive connectors 455 to each of the thermally conductive vias 451, respectively. The thermally conductive connectors 455 are thermally connected to the thermally conductive pads 453, thereby being thermally connected to the thermally conductive vias 451. Through the thermally conductive pads 453 and the thermally conductive vias 451, the thermally conductive connectors 455 may thermally connect the stack 300 of the second semiconductor dies to the heat dissipation layer 400.

Each of the thermally conductive connectors 455 may have a shape of an electrical connection element such as a bump. Each of the thermally conductive connectors 455 may be made of or include a thermally conductive material. Each of the thermally conductive connectors 455 may be made of or include a solder material. Each of the thermally conductive connectors 455 may be made of or include a metallic material. Each of the thermally conductive connectors 455 may be made of or include gold (Au), silver (Ag), tin (Sn), or copper (Cu).

Referring to FIG. 3, the thermally conductive connectors 455 might not be electrically connected to the stack 300 of the second semiconductor dies. The stack 300 of the second semiconductor dies may further include an insulation layer 390 that electrically insulates the thermally conductive connectors 455 from the second semiconductor dies 301. The thermally conductive connectors 455 may be connected or coupled to a surface 390S of the insulation layer 390. The thermally conductive connectors 455 may be electrically insulated from the second semiconductor dies 301 by the insulation layer 390. The insulation layer 390 may include a passivation layer disposed in the base die 310.

Referring to FIGS. 3 and 1 again, the stack 300 of the second semiconductor dies may be disposed to be overlapped by the heat dissipation layer 400. The thermally conductive vias 451, the thermally conductive pads 453, and the thermally conductive connectors 455 may be overlapped by the heat dissipation layer 400 and be disposed over the stack 300 of the second semiconductor dies. Because the thermally conductive vias 451, the thermally conductive pads 453, and the thermally conductive connectors 455 are located between the heat dissipation layer 400 and the stack 300 of the second semiconductor dies, the heat transfer paths through the thermally conductive connection part 450 may be substantially the shortest distance. Accordingly, heat transfer from the stack 300 of the second semiconductor dies to the heat dissipation layer 400 may be efficiently implemented.

The semiconductor package 10 may further include an electrical connection part 410. The electrical connection part 410 may electrically connect the stack 300 of the second semiconductor dies to the first semiconductor die 200. The electrical connection part 410 may configure electrical and signal paths for electrically and signally connecting the stack 300 of the second semiconductor dies to the first semiconductor die 200. The stack 300 of the second semiconductor dies and the first semiconductor die 200 may communicate data signals with each other through the electrical connection part 410. The electrical connection part 410 may be configured by combining a plurality of electrically conductive elements.

The electrical connection part 410 may include a plurality of electrically conductive pads 413 disposed on the second surface 102 of the interposer 100. The electrical connection part 410 may further include a plurality of first inner wirings 411 disposed in the interposer 100. The electrical connection part 410 may further include a plurality of electrically conductive connectors 415 introduced between the second surface 102 of the interposer 100 and the stack 300 of the second semiconductor dies.

The electrically conductive pads 413 may be disposed on the second surface 102 of the interposer 100 to be spaced apart from the thermally conductive pads 453. The electrically conductive pads 413 may be formed in patterns substantially the same as the thermally conductive pads 453. Each of the electrically conductive pads 413 may be made of or include an electrically conductive material. Each of the electrically conductive pads 413 may be made of or include a metallic material such as copper (Cu).

Each of the first inner wirings 411 may be electrically connected to each of the electrically conductive pads 413, respectively. The first inner wirings 411 may electrically connect the electrically conductive pads 413 to the first semiconductor die 200. Each of the first inner wirings 411 may be disposed in the interposer 100 to extend from each of the electrically conductive pads 413 to each of the first connector pads 111, respectively. Each of the first inner wirings 411 may include a second electrical through via 411V and a connection pattern 411L. The second electrical through via 411V may be an electrically conductive element connecting the first connector pad 111 and the connection pattern 411L in a substantially vertical direction. The second electrical through via 411V may be disposed in a TSV shape that substantially penetrates the interposer 100. The connection pattern 411L may be an electrically conductive element that electrically connects the second electrical through via 411V and the electrically conductive pad 413.

Each of the electrically conductive connectors 415 may be electrically connected to each of the electrically conductive pads 413, respectively. The electrically conductive connectors 415 may electrically connect the stack 300 of the second semiconductor dies and the electrically conductive pads 413 to each other. By the electrically conductive connectors 415, the stack 300 of the second semiconductor dies may be electrically and structurally connected to the interposer 100. The electrically conductive connectors 415 may be made of or include an electrically conductive material. The electrically conductive connectors 415 may be made of or include a solder material or a metallic material such as gold (Au) or copper (Cu).

The electrically conductive connectors 415 may be disposed between the stack 300 of the second semiconductor dies and the interposer 100 while being spaced apart from the thermally conductive connectors 455. The electrically conductive connectors 415 might not be electrically connected to the thermally conductive connectors 455 and may be isolated from the thermally conductive connectors 455. The electrically conductive connectors 415 may be made of or include substantially the same material as the thermally conductive connectors 455. Each of the electrically conductive connectors 415 and each of the thermally conductive connectors 455 may have a bump shape.

Each of the electrically conductive connectors 415 may be electrically connected to each of the second connector pads 351, respectively, of the stack 300 of the second semiconductor dies. The second connector pads 351 may be electrically connected to the first electrical through vias 330 through the second inner wirings 352. The second inner wirings 352 may be provided in the base die 310 among the second semiconductor dies 301.

Figure 4:
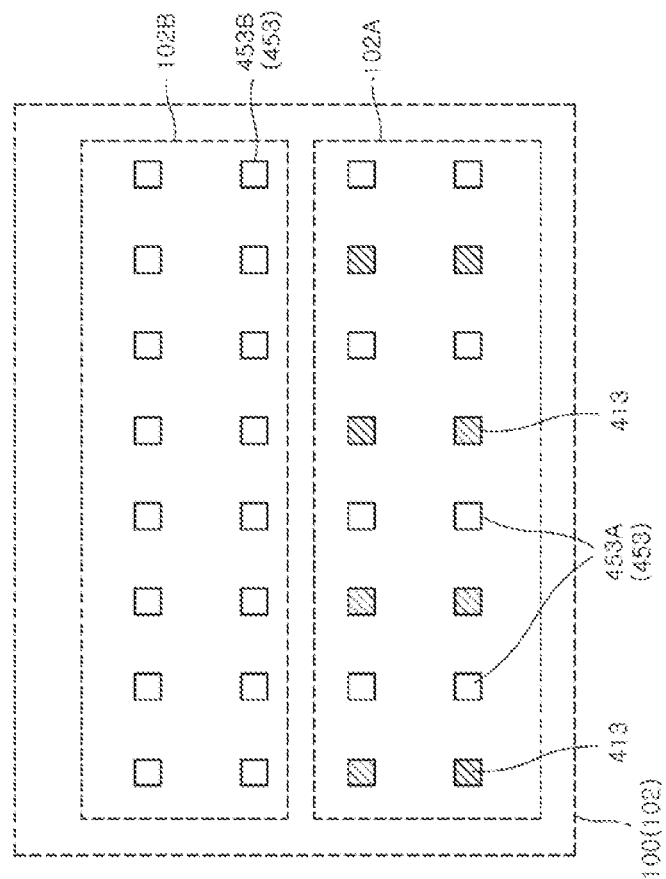
FIG. 4 is a schematic plan view illustrating a planar arrangement shape of pads of the semiconductor package of FIG. 3.

FIG. 4 is a schematic plan view illustrating an arrangement pattern of the electrically conductive pads 413 and the thermally conductive pads 453 of the interposer 100 of FIG. 3.

Referring to FIGS. 4 and 3, first thermally conductive pads 453A, which are included in the thermally conductive pads 453, may be disposed on the second surface 102 of the interposer 100 so as to be positioned between the electrically conductive pads 413. Second thermally conductive pads 453B, which are also included in the thermally conductive pads 453, may be disposed in a second region 102B, which is a different region separated from a first region 102A of the second surface 102 of the interposer 100, on which the electrically conductive pads 413 are disposed. Because the second thermally conductive pads 453B are also disposed in the second region 102B outside of the first region 102A in which the electrically conductive pads 413 are disposed, the number of heat transfer paths for transferring heat to the heat dissipation layer 400 may be increased. Accordingly, the heat dissipation effect from the stack 300 of the second semiconductor dies to the heat dissipation layer 400 may be further improved.

Figure 5:
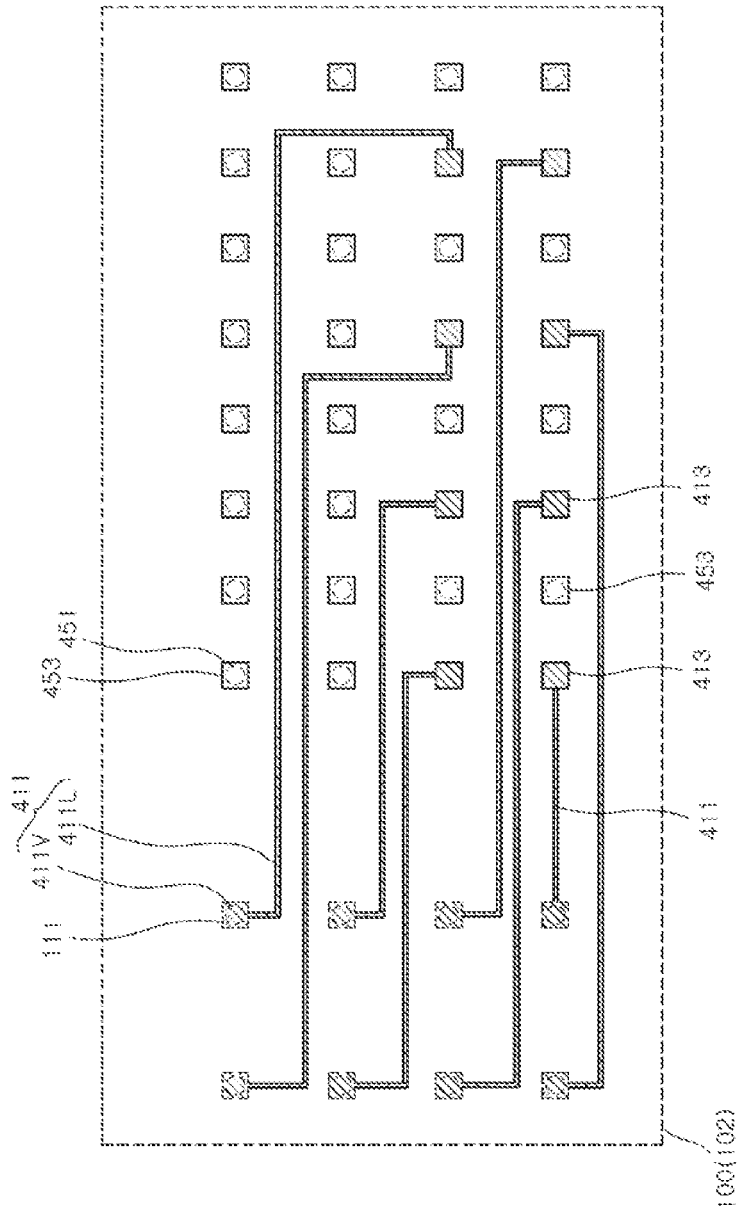
FIG. 5 is a schematic plan view illustrating a planar arrangement shape of connection patterns of the semiconductor package of FIG. 3.

FIG. 5 is a schematic plan view illustrating an arrangement pattern of the connection patterns 411L of the semiconductor package 10 of FIG. 3.

Referring to FIG. 5 together with FIG. 4, some of the connection patterns 411L of the first inner wirings 411 may extend to be spaced apart from the thermally conductive pads 453. Some of the connection patterns 411L may extend between each of the thermally conductive vias 451. Some of the connection patterns 411L may extend to be spaced apart from the thermally conductive vias 451. Some of the connection patterns 411L may extend between each of the thermally conductive vias 451.

Figure 6:
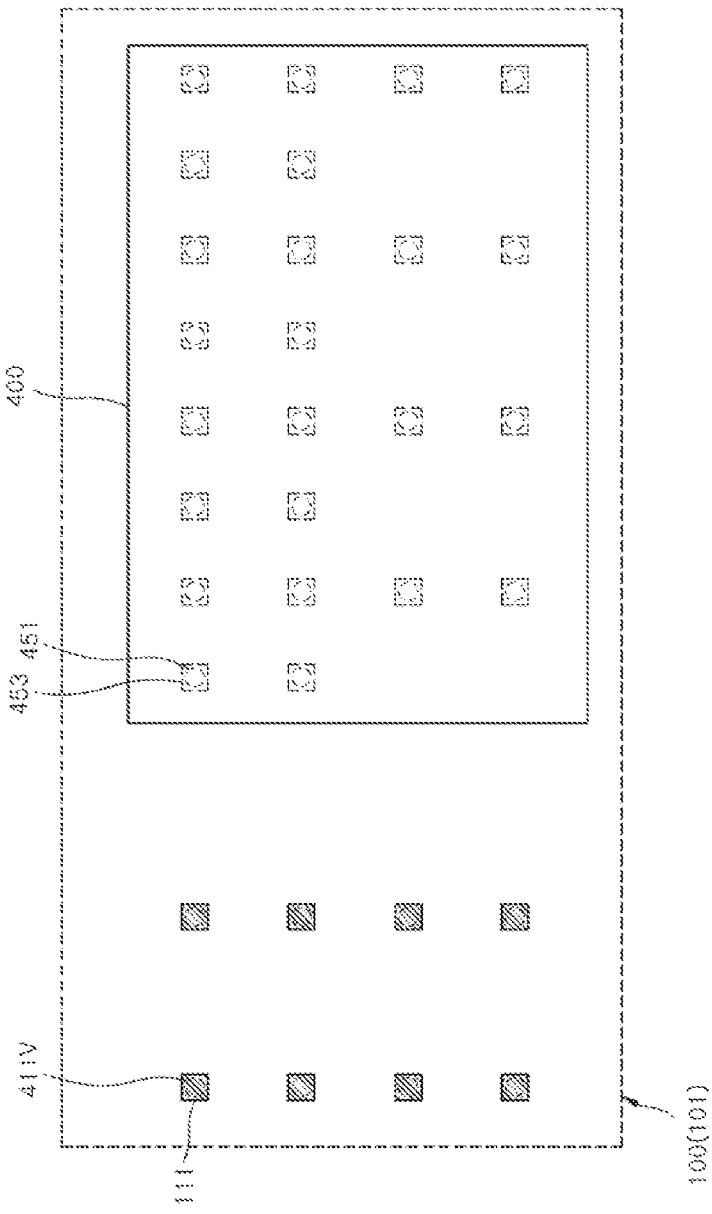
FIG. 6 is a schematic plan view illustrating a planar shape of the heat dissipation layer of the semiconductor package of FIG. 3.

FIG. 6 is a schematic plan view illustrating a planar shape of the heat dissipation layer 400 of the semiconductor package 10 of FIG. 3.

Referring to FIG. 6 together with FIG. 3, the heat dissipation layer 400 may have a flat plate shape under the first surface 101 of the interposer 100. The thermally conductive pads 453 and the thermally conductive vias 451 may be positioned to overlap the heat dissipation layer 400.

Figure 7:
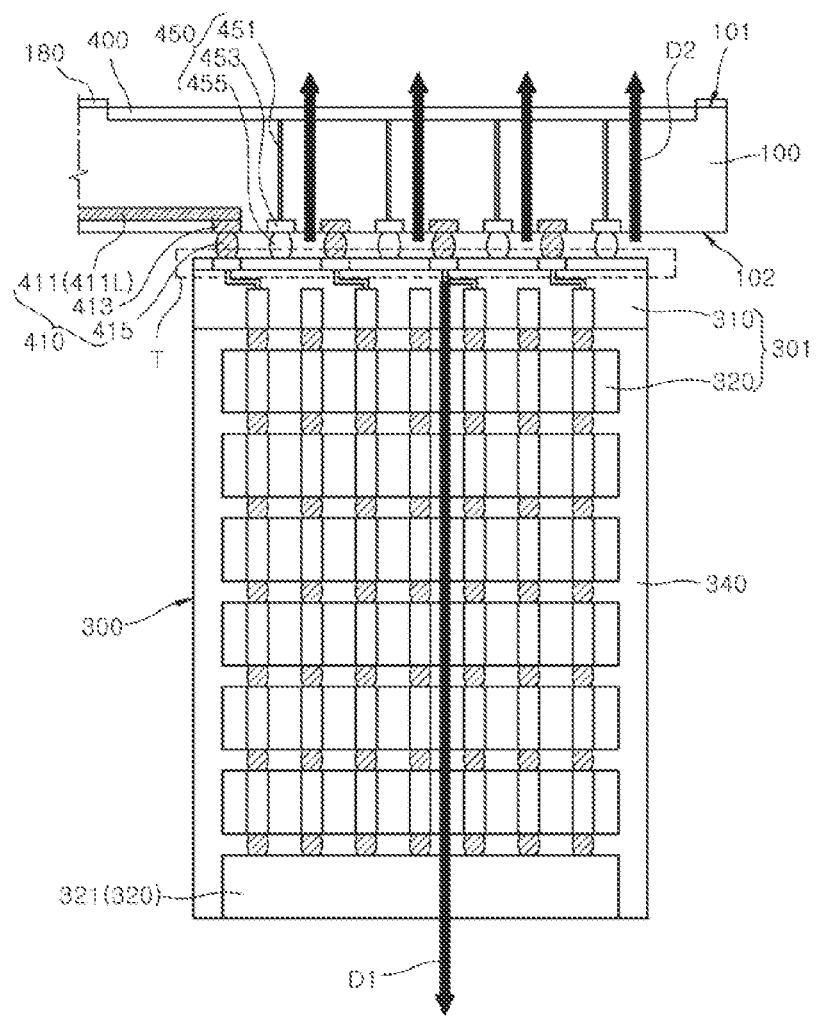
FIG. 7 is an enlarged schematic cross-sectional view illustrating a portion of the stack of the second semiconductor dies of the semiconductor package of FIG. 1.

FIG. 7 is an enlarged schematic cross-sectional view illustrating portions of the heat dissipation layer 400 and the stack 300 of the second semiconductor dies of the semiconductor package of FIG. 1.

Referring to FIG. 7 together with FIG. 1, the thermally conductive connection part 450 may transfer heat generated in the stack 300 of the second semiconductor dies to the heat dissipation layer 400. While the stack 300 of the second semiconductor dies communicates with the first semiconductor die 100, heat may be generated in a region where the stack 300 of the second semiconductor dies and the second surface 102 of the interposer 100 face each other. Because the core dies 320 are stacked under a heat generation region T and the encapsulation layer 340 may interfere with heat transfer, the heat generated in the heat generation region T may be difficult to transfer in a direction D1 in which the second semiconductor dies 301 are stacked. Because the thermally conductive connection part 450 substantially extends to the heat generation region T, the heat may be transferred through the thermally conductive connection part 450 in a direction D2 to the heat dissipation layer 400 without interference. Accordingly, the transferred heat may be dissipated through the heat dissipation layer 400.

Figure 8:
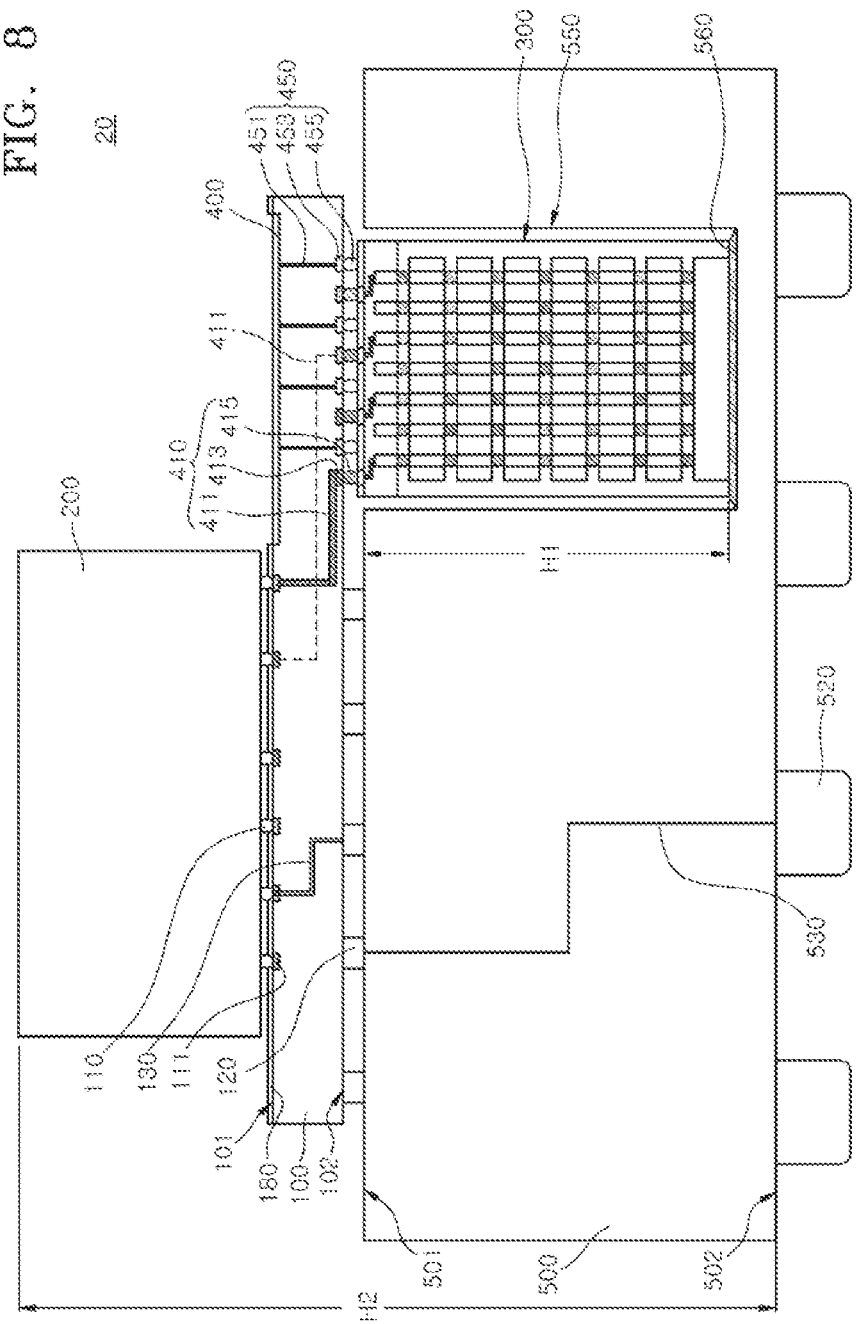
FIG. 8 is a schematic cross-sectional view illustrating a semiconductor package according to an embodiment of the present disclosure.

FIG. 8 is a schematic cross-sectional view illustrating a semiconductor package 20 according to an embodiment of the present disclosure. In FIG. 8, the same reference numerals as in FIG. 1 may indicate the same elements.

Referring to FIG. 8, the semiconductor package 20 may include an interposer 100, a first semiconductor die 200, a stack 300 of second semiconductor dies, and a package substrate 500. The interposer 100 may electrically or signally connect the first semiconductor die 200 to the package substrate 500. The interposer 100 may electrically or signally connect the stack 300 of the second semiconductor dies to the package substrate 500.

The first semiconductor die 200 may be mounted on a first surface 101 of the interposer 100. First connectors 110 may connect the first semiconductor die 200 to first connector pads 111 of the interposer 100. The interposer 100 may include a heat dissipation layer 400 on the first surface 101. The stack 300 of the second semiconductor dies may be mounted on a second surface 102 of the interposer 100.

The semiconductor package 20 may further include a thermally conductive connection part 450 and an electrical connection part 410. The electrical connection part 410 may include a first inner wiring 411, an electrically conductive pad 413, and an electrically conductive connector 415. The thermally conductive connection part 450 may include a thermally conductive via 451, a thermally conductive pad 453, and a thermally conductive connector 455.

The package substrate 500 may be a connection element electrically connecting the first semiconductor die 200 and the stack 300 of the second semiconductor dies to external devices. The package substrate 500 may be a printed circuit board (PCB). Second connectors 120 electrically connected to the interposer 100 may be bonded to a first surface 510 of the package substrate 500. The interposer 100 may further include third internal wirings 130 electrically connecting the second connectors 120 and the first connector pads 111. Outer connectors 520 may be attached to a second surface 502 of the package substrate 500.

The package substrate 500 may further include a cavity 550 formed under the first surface 501. The stack 300 of the second semiconductor dies may be inserted into the cavity 550. An adhesive layer 560 may adhere the stack 300 of the second semiconductor dies to a bottom of the cavity 550. As the stack 300 of the second semiconductor dies is inserted into the cavity 500, the interposer 100 may be mounted on a first surface 501 of the package substrate 500. Inserting the stack 300 of the second semiconductor dies into the cavity 500 allows for a reduction in total thickness H2 of the semiconductor package 20. For example, the total thickness is reduced by a thickness H1 of the portion of the stack 300 of the second semiconductor dies inserted into the cavity 550. If the stack 300 of the second semiconductor dies is mounted over the first surface 501 of the package substrate 500 rather than the cavity 550, the total thickness of the semiconductor package 20 may be thickness H1+H2 increased by H1. However, in the embodiment, the stack 300 of the second semiconductor dies is inserted into the cavity 550, and thus, the effect of substantially reducing the thickness of the semiconductor package 20 may be realized.

When the stack 300 of the second semiconductor dies is inserted into the cavity 550, the stack 300 of the second semiconductor dies may be surrounded by the sidewall and bottom of the cavity 550. The sidewall and bottom of the cavity 550 surrounding the stack 300 of the second semiconductor dies may limit or curtail heat dissipation from the stack 300 of the second semiconductor dies. The heat dissipation layer 400 and the electrical connection part 410 may contribute to dissipating heat generated in the stack 300 of the second semiconductor dies. Therefore, even when the stack 300 of the semiconductor dies is inserted into the cavity 550, the heat generation problem in which heat accumulates in the stack 300 of the semiconductor dies may be reduced, suppressed, or prevented.

The stack 300 of the second semiconductor dies and the first semiconductor die 200 may be disposed on opposite surfaces of the interposer 100 without vertically overlapping each other. The horizontal spaced-apart distance between the stack 300 of the second semiconductor dies and the first semiconductor die 200 is increased compared to the case where the stack 300 of the second semiconductor dies is overlapped by the first semiconductor die 200. Accordingly, heat transfer to the first semiconductor die 200 from the stack 300 of the second semiconductor dies may be reduced or prevented.

The first semiconductor die 200 may be positioned and/or shaped so as to reduce or eliminate an amount of overlap with the heat dissipation layer 400. Further, the first semiconductor die 200 may be spaced apart from the heat dissipation layer 400. Because the first semiconductor die 200 covers or shields the heat dissipation layer 400 to a lesser extent, the first semiconductor die 200 does not substantially impede or interfere with the heat dissipation function of the heat dissipation layer 400. In addition, because the first semiconductor die 200 may not overlap the heat dissipation layer 400, the heat generated by the operation of the first semiconductor die 200 may be reduced or prevented from being transferred to the stack 300 of the second semiconductor dies through the heat dissipation layer 400. Although not illustrated, the semiconductor package 20 may further include an additional heat spreader that thermally contacts the heat dissipation layer 400 or thermally contacts the first semiconductor die 200. Although not illustrated, the semiconductor package 20 may further include an encapsulant protecting the interposer 100 and the first semiconductor die 200.

Figure 9:
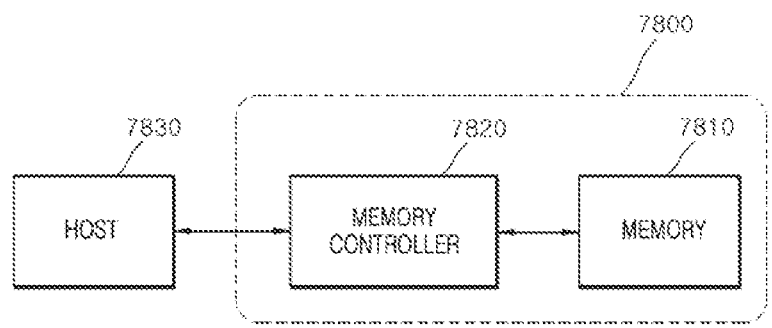
FIG. 9 is a block diagram illustrating an electronic system employing a memory card including a package according to an embodiment of the present disclosure.

FIG. 9 is a block diagram illustrating an electronic system including a memory card 7800 employing at least one of the semiconductor packages according to the embodiments. The memory card 7800 includes a memory 7810 such as a nonvolatile memory device, and a memory controller 7820. The memory 7810 and the memory controller 7820 may store data or read out stored data. At least one of the memory 7810 and the memory controller 7820 may include at least one semiconductor package according to an embodiment of the present teachings.

The memory 7810 may include a nonvolatile memory device to which the technology of the embodiments of the present disclosure is applied. The memory controller 7820 may control the memory 7810 such that stored data is read out or data is stored in response to a read/write request from a host 7830.

Figure 10:
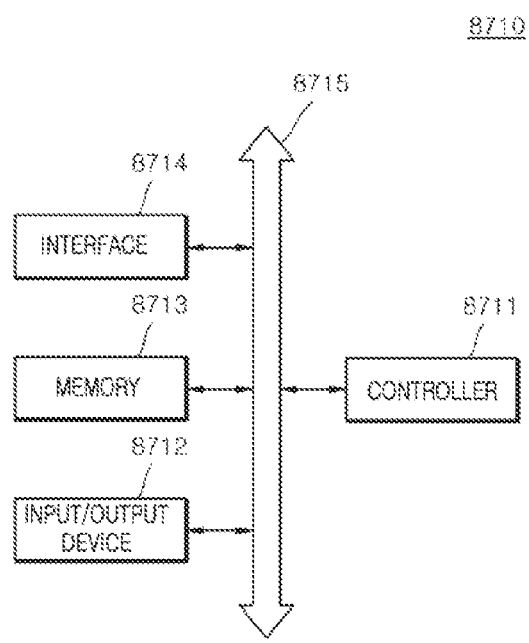
FIG. 10 is a block diagram illustrating an electronic system including a package according to an embodiment of the present disclosure.

FIG. 10 is a block diagram illustrating an electronic system 8710 including at least one semiconductor package according to an embodiment of the present teachings. The electronic system 8710 may include a controller 8711, an input/output device 8712, and a memory 8713. The controller 8711, the input/output device 8712, and the memory 8713 may be coupled with one another through a bus 8715 providing a path through which data moves.

In an embodiment, the controller 8711 may include at least one microprocessor, digital signal processor, microcontroller, and/or logic device capable of performing the same functions as these components. The controller 8711 and/or the memory 8713 may include at least one semiconductor package according to an embodiment of the present disclosure. The input/output device 8712 may include at least one selected among a keypad, a keyboard, a display device, a touchscreen, and so forth. The memory 8713 is a device for storing data. The memory 8713 may store data and/or commands to be executed by the controller 8711, and the like.

The memory 8713 may include a volatile memory device such as a DRAM device and/or a nonvolatile memory device such as a flash memory device. For example, a flash memory device may be mounted to an information processing system such as a mobile terminal or a desktop computer. The flash memory device may constitute a solid state disk (SSD). In this case, the electronic system 8710 may stably store a large amount of data in a flash memory system.

The electronic system 8710 may further include an interface 8714 configured to transmit and receive data to and from a communication network. The interface 8714 may be a wired or wireless type. For example, the interface 8714 may include an antenna or a wired or wireless transceiver.

The electronic system 8710 may be realized as a mobile system, a personal computer, an industrial computer, or a logic system performing various functions. For example, the mobile system may be any one of a personal digital assistant (PDA), a portable computer, a tablet computer, a mobile phone, a smart phone, a wireless phone, a laptop computer, a memory card, a digital music system, and an information transmission/reception system.

If the electronic system 8710 represents equipment capable of performing wireless communication, the electronic system 8710 may be used in a communication system using a protocol such as CDMA (code division multiple access), GSM (global system for mobile communications), NADC (north American digital cellular), E-TDMA (enhanced-time division multiple access), WCDMA (wideband code division multiple access), CDMA2000, LTE (long term evolution), or Wibro (wireless broadband Internet).

The present teachings have been disclosed in conjunction with some embodiments as described above. Those skilled in the art will appreciate that various modifications, additions, and/or substitutions are possible, without departing from the scope and spirit of the present disclosure. Accordingly, the embodiments disclosed in the present specification should be considered from not a restrictive standpoint but rather an illustrative standpoint. The scope of the present teachings is not limited to the above descriptions but defined by the accompanying claims, and all distinctive features in an equivalent scope should be construed as being included in the present teachings.

What is claimed is:

1. A semiconductor package comprising:
    an interposer including first and second surfaces opposite to each other;
    a heat dissipation layer disposed on the first surface of the interposer;
    a first semiconductor die mounted on the first surface of the interposer;
    a stack of second semiconductor dies mounted on the second surface of the interposer; and
    a thermally conductive connection part for transferring heat from the stack of the second semiconductor dies to the heat dissipation layer,
    wherein the interposer further includes a passivation layer exposing a surface of the heat dissipation layer on the first surface of the interposer.

2. The semiconductor package of claim 1, wherein the heat dissipation layer is positioned to overlap the stack of the second semiconductor dies.

3. The semiconductor package of claim 1, wherein the first semiconductor die is positioned to not overlap the heat dissipation layer.

4. The semiconductor package of claim 1, wherein the first semiconductor die is positioned to not overlap the stack of the second semiconductor dies.

5. The semiconductor package of claim 1, wherein the thermally conductive connection part includes:
    a plurality of thermally conductive vias connected to the heat dissipation layer while substantially vertically penetrating the interposer; and
    a plurality of thermally conductive connectors positioned between the second surface of the interposer and the stack of the second semiconductor dies and thermally connected to the thermally conductive vias.

6. The semiconductor package of claim 5,
    wherein the stack of the second semiconductor dies includes an insulation layer electrically insulating the thermally conductive connectors from the second semiconductor dies, and
    wherein the thermally conductive connectors are connected to a surface of the insulation layer.

7. The semiconductor package of claim 5, wherein the thermally conductive connection part includes a plurality of thermally conductive pads disposed on the second surface of the interposer, wherein the plurality of thermally conductive pads thermally connect the thermally conductive connectors to the thermally conductive vias.

8. The semiconductor package of claim 7, further comprising an electrical connection part electrically connecting the stack of the second semiconductor dies to the first semiconductor die while being spaced apart from the thermally conductive connection part.

9. The semiconductor package of claim 8, wherein the electrical connection part includes:
    electrically conductive pads disposed on the second surface of the interposer to be spaced apart from the thermally conductive pads;
    inner wirings disposed in the interposer to electrically connect the electrically conductive pads to the first semiconductor die; and
    electrically conductive connectors electrically connecting the electrically conductive pads to the stack of the second semiconductor dies, wherein the electrically conductive connectors are spaced apart from the thermally conductive connectors.

10. The semiconductor package of claim 9, wherein each of the thermally conductive connectors and the electrically conductive connectors has a shape of a bump.

11. The semiconductor package of claim 9, wherein the inner wirings include conductive patterns extending to be spaced apart from the thermally conductive pads and the thermally conductive vias.

12. The semiconductor package of claim 9, wherein a first portion of the thermally conductive pads are positioned between the electrically conductive pads.

13. The semiconductor package of claim 9, wherein a second portion of the thermally conductive pads are positioned outside the electrically conductive pads.

14. The semiconductor package of claim 1, wherein the stack of the second semiconductor dies includes electrical through vias electrically connecting the second semiconductor dies to each other vertically.

15. The semiconductor package of claim 1, wherein the stack of the second semiconductor dies comprises a high bandwidth memory (HBM) device including:
    a base die positioned closest to the interposer among the second semiconductor dies; and
    a plurality of core dies stacked substantially vertically under the base die.

16. A semiconductor package comprising:
    an interposer including first and second surfaces opposite to each other;
    a heat dissipation layer disposed on the first surface of the interposer;
    a first semiconductor die mounted on the first surface of the interposer;
    a stack of second semiconductor dies mounted on the second surface of the interposer; and
    a thermally conductive connection part comprising:
        a thermally conductive via penetrating through the interposer to thermally connect with the heat dissipation layer disposed on the first surface of the interposer; and a thermally conductive connector thermally connecting the thermally conductive via to the stack of second semiconductor dies mounted on the second surface of the interposer,
wherein the interposer further includes a passivation layer exposing a surface of the heat dissipation layer on the first surface of the interposer.

\* \* \* \* \*